(12) United States Patent
Miyata et al.

(10) Patent No.: US 12,062,675 B2
(45) Date of Patent: Aug. 13, 2024

(54) DEVICE INCLUDING AN α-RAY SOURCE AND AN ELECTRONIC CIRCUIT INFLUENCED BY α-RAY

(71) Applicant: FUJIFILM Corporation, Tokyo (JP)

(72) Inventors: Tetsushi Miyata, Haibara-gun (JP);
Hirotaka Takishita, Haibara-gun (JP);
Hidekazu Ohashi, Haibara-gun (JP);
Mitsuru Sawano, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1144 days.

(21) Appl. No.: 16/859,238

(22) Filed: Apr. 27, 2020

(65) Prior Publication Data

US 2020/0258798 A1 Aug. 13, 2020

Related U.S. Application Data

(63) Continuation of application No. PCT/JP2018/040885, filed on Nov. 2, 2018.

(30) Foreign Application Priority Data

Nov. 9, 2017 (JP) .................................. 2017-216353

(51) Int. Cl.
*H01L 27/146* (2006.01)
*G21F 1/10* (2006.01)
(Continued)

(52) U.S. Cl.
CPC ............ *H01L 27/1462* (2013.01); *G21F 1/10* (2013.01); *G21F 1/103* (2013.01); *G21F 1/106* (2013.01); *G21F 1/12* (2013.01); *H01L 23/293* (2013.01); *H01L 27/14621* (2013.01); *H01L 27/14625* (2013.01); *H01L 23/291* (2013.01)

(58) Field of Classification Search
None
See application file for complete search history.

(56) References Cited

U.S. PATENT DOCUMENTS 5,406,025 A * 4/1995 Carlstedt ............... H01L 23/057
174/541
5,998,862 A * 12/1999 Yamanaka ........ H01L 27/14618
257/E31.118

(Continued)

FOREIGN PATENT DOCUMENTS

JP 60-134448 A 7/1985
JP 60134448 A * 7/1985 ........... H01L 23/552

(Continued)

OTHER PUBLICATIONS

Japanese Office Action for corresponding Japanese Application No. 2019-552765, dated Jul. 13, 2021, with English translation.

(Continued)

*Primary Examiner* — Scott B Geyer
(74) *Attorney, Agent, or Firm* — Birch, Stewart, Kolasch & Birch, LLP

(57) ABSTRACT

A device in which the influence of α-ray is reduced, and a composition for forming an organic layer. The device includes an α-ray source, an electronic circuit influenced by α-ray, and an organic layer including an α-ray shielding agent, in which an α-ray shielding ability X of the α-ray shielding agent is 0.50 or less.

17 Claims, 5 Drawing Sheets

(51) Int. Cl.
*G21F 1/12* (2006.01)
*H01L 23/29* (2006.01)

(56) References Cited

U.S. PATENT DOCUMENTS

| | | | |
|---|---|---|---|
| 2002/0076913 A1* | 6/2002 | Lee | H01L 24/11 |
| | | | 257/E21.508 |
| 2003/0063053 A1 | 4/2003 | Yamazaki et al. | |
| 2005/0062871 A1* | 3/2005 | Nishida | H01L 27/14625 |
| | | | 257/E31.127 |
| 2005/0212069 A1* | 9/2005 | Sato | H04N 23/57 |
| | | | 348/E5.079 |
| 2005/0219399 A1* | 10/2005 | Sato | H01L 27/14618 |
| | | | 348/340 |
| 2006/0051887 A1* | 3/2006 | Yamamoto | H01L 27/14683 |
| | | | 438/64 |
| 2006/0091488 A1* | 5/2006 | Kang | H01L 31/02161 |
| | | | 257/E31.127 |
| 2007/0054135 A1 | 3/2007 | Morita et al. | |
| 2007/0072392 A1* | 3/2007 | Ooseki | H01L 27/14683 |
| | | | 438/455 |
| 2007/0194438 A1* | 8/2007 | Takasaki | H01L 21/67132 |
| | | | 257/E31.117 |
| 2009/0217706 A1* | 9/2009 | Weber | C03B 5/43 |
| | | | 65/106 |
| 2009/0302471 A1* | 12/2009 | Yamano | H01L 24/11 |
| | | | 257/E23.168 |
| 2012/0076948 A1 | 3/2012 | Enomoto et al. | |
| 2012/0199929 A1* | 8/2012 | Kamijyo | H01L 27/14618 |
| | | | 359/359 |
| 2012/0243077 A1* | 9/2012 | Osawa | H01L 27/14621 |
| | | | 359/356 |
| 2014/0070348 A1* | 3/2014 | Yee | H01L 27/14636 |
| | | | 257/E31.127 |
| 2014/0205780 A1* | 7/2014 | Gaynes | C09D 5/24 |
| | | | 252/514 |
| 2014/0252526 A1* | 9/2014 | Wakiyama | H01L 31/02165 |
| | | | 257/433 |
| 2017/0017023 A1* | 1/2017 | Sugiyama | H01L 27/14618 |
| 2018/0158858 A1* | 6/2018 | Moriya | G02B 3/00 |
| 2018/0188422 A1* | 7/2018 | Fujii | G02B 3/0068 |
| 2019/0206925 A1* | 7/2019 | Yamamoto | H01L 27/14627 |

FOREIGN PATENT DOCUMENTS

| | | | | |
|---|---|---|---|---|
| JP | 63-239977 A | 10/1988 | | |
| JP | 5-36865 A | 2/1993 | | |
| JP | 7-281021 A | 10/1995 | | |
| JP | 2002-261346 A | 9/2002 | | |
| KR | 10-2003-0027846 A | 4/2003 | | |
| TW | 200714636 A | 4/2007 | | |
| TW | 201214040 A1 | 4/2012 | | |
| WO | WO 2011/055726 A1 | 5/2011 | | |
| WO | WO-2011055726 A1 * | 5/2011 | | G02B 5/208 |

OTHER PUBLICATIONS

Korean Office Action, dated Aug. 26, 2021, for corresponding Korean Application No. 10-2020-7012318, with an English machine translation.
International Preliminary Report on Patentability and Written Opinion of the International Searching Authority (PCT/IB/326, PCT/IB/373 and PCT/ISA/210) for International Application No. PCT/JP2018/040885, dated May 22, 2020, with English translation.
International Search Report (Form PCT/ISA/210) for International Application No. PCT/JP2018/040885, dated Jan. 15, 2019, with English translation.
Taiwanese Office Action and Search Report for corresponding Taiwanese Application No. 107139596, dated Apr. 8, 2022, with a partial English translation.

* cited by examiner

DEVICE INCLUDING AN α-RAY SOURCE AND AN ELECTRONIC CIRCUIT INFLUENCED BY α-RAY

CROSS-REFERENCE TO RELATED APPLICATIONS

This application is a Continuation of PCT International Application No. PCT/JP2018/040885 filed on Nov. 2, 2018, which claims priority under 35 U.S.C. § 119(a) to Japanese Patent Application No. 2017-216353 filed on Nov. 9, 2017. The above application is hereby expressly incorporated by reference, in its entirety, into the present application.

BACKGROUND OF THE INVENTION

1. Field of the Invention

The present invention relates to a device and a composition for forming an organic layer.

2. Description of the Related Art

A device including an electronic circuit has been applied to various uses. Examples of the device include a solid-state imaging device including a solid-state imaging element (corresponding to the electronic circuit).

On the other side, in the device including an electronic circuit, a soft error may occur due to an influence of α-ray emitted from an α-ray source in the device. For example, in the solid-state imaging device, a cover glass may include α-ray-emitting atoms, which causes the solid-state imaging element corresponding to the electronic circuit a transient malfunction.

Regarding this, JP1995-281021A (JP-H07-281021A) proposes a near-infrared absorbing glass in which the contents of U and Th are equal to or less than a certain value.

SUMMARY OF THE INVENTION

In recent years, in various devices, it is required to further suppress the influence of α-ray.

However, from such an aspect described in JP1995-281021A (JP-H07-281021A), it is technically difficult to further remove impurities and it is difficult to further reduce α-ray emission from a predetermined member (for example, cover glass). In addition, such a method is industrially inferior due to an increase in purification costs.

The present invention has been made in view of the above-described circumstances, and an object of the present invention is to provide a new device in which the influence of α-ray is reduced.

Another object of the present invention is to provide a composition for forming an organic layer.

As a result of intensive studies to achieve the object, the present inventors have found that the object can be achieved by the following configuration.

(1) A device comprising:
an α-ray source;
an electronic circuit influenced by α-ray; and
an organic layer including an α-ray shielding agent,
in which an α-ray shielding ability X of the α-ray shielding agent, which is calculated by the method described later, is 0.50 or less.

(2) The device according to (1),
in which the α-ray source is a glass substrate,
the electronic circuit is a solid-state imaging element including a photoelectric conversion portion,
the organic layer is disposed between the α-ray source and the electronic circuit, and
the device functions as a solid-state imaging device.
(3) The device according to (2),
in which a thickness of the organic layer is 20 μm or less.
(4) The device according to (2) or (3),
in which a minimum transmittance of the organic layer in a visible light region is 70% or more.
(5) The device according to (1),
in which the electronic circuit is one selected from the group consisting of a logic circuit, a storage circuit, and a communication circuit, and
the device functions as an electronic module.
(6) The device according to (5), further comprising:
at least one selected from the group consisting of a solder ball electrically connected to the electronic circuit, a solder bump electrically connected to the electronic circuit, and a mold including a filler, which covers at least a part of the electronic circuit,
in which the α-ray source is at least one of the solder ball, the solder bump, or the filler.
(7) The device according to any one of (1) to (6),
in which the α-ray shielding agent is a polymer.
(8) The device according to any one of (1) to (7),
in which a density of the α-ray shielding agent is 1.4 g/cm$^3$ or more.
(9) The device according to any one of (1) to (8),
in which an ionization potential parameter of the α-ray shielding agent is 7000 kJ/mol Å or more.
(10) The device according to any one of (1) to (9),
in which a refractive index of the α-ray shielding agent at a wavelength of 589.3 nm is 1.7 or more.
(11) The device according to any one of (1) to (10),
in which the α-ray shielding agent includes a halogen atom.
(12) The device according to any one of (1) to (6),
in which the α-ray shielding agent is metal particles or metal oxide particles having a density of 4.0 g/cm$^3$ or more.
(13) A composition for forming an organic layer, comprising:
an organic substance of which a content in a total solid content is 15% by mass or more,
in which the organic substance includes an α-ray shielding agent of which an α-ray shielding ability X calculated by the method described later is 0.50 or less.

According to the present invention, it is possible to provide a new device in which the influence of α-ray is reduced.

In addition, according to the present invention, it is possible to provide a composition for forming an organic layer.

DESCRIPTION OF THE PREFERRED EMBODIMENTS

Hereinafter, the present invention will be described in detail.

The description of the constitutional requirements described below is made on the basis of representative embodiments of the present invention, but it should not be construed that the present invention is limited to those embodiments.

In this specification, numerical value ranges expressed by the term "to" mean that the numerical values described before and after "to" are included as a lower limit value and an upper limit value, respectively.

In addition, in the present invention, 1 Å (angstrom) corresponds to 0.1 nm.

First Embodiment

Figure 1:
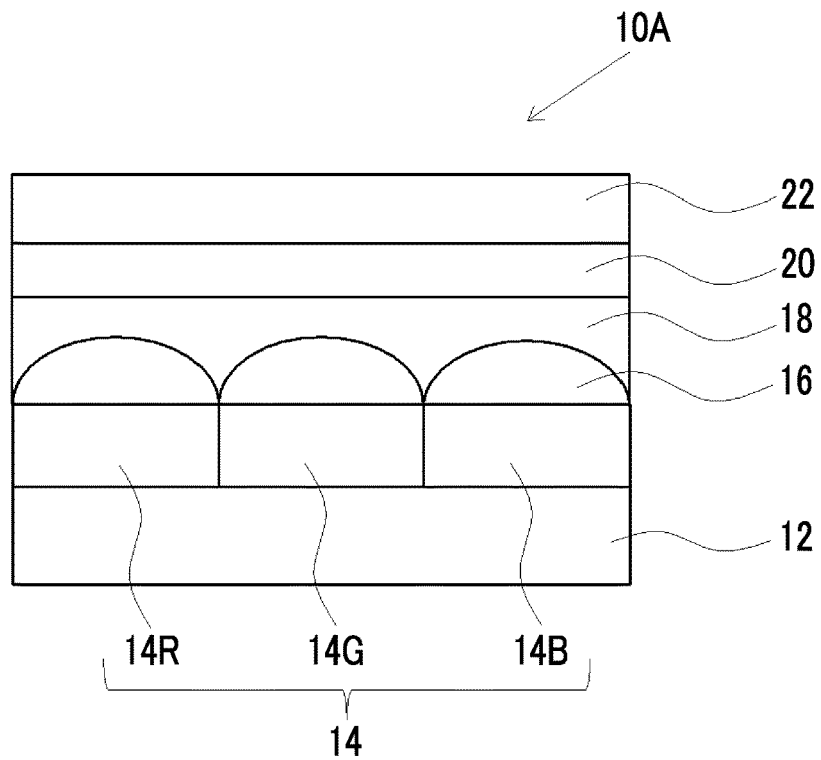
FIG. 1 is a cross-sectional view illustrating an embodiment of a solid-state imaging device which is a device of the present invention.

FIG. 1 shows a first embodiment of the device according to an embodiment of the present invention.

The device shown in FIG. 1 is a solid-state imaging device 10A, and the solid-state imaging device 10A includes a solid-state imaging element 12 having a photoelectric conversion portion (not shown), a color filter 14, a microlens 16, a transparent resin layer 18, an organic layer 20 including a predetermined α-ray shielding agent described later, and a glass substrate 22 in this order.

The glass substrate 22 corresponds to an α-ray source in the device according to the embodiment of the present invention, and the solid-state imaging element 12 having a photoelectric conversion portion corresponds to an electronic circuit influenced by α-ray in the device according to the embodiment of the present invention. As shown in FIG. 1, the organic layer 20 is disposed between the glass substrate 22 and the solid-state imaging element 12 so that α-ray emitted from the glass substrate 22 does not reach the solid-state imaging element 12.

Hereinafter, each member constituting the solid-state imaging device 10A will be described in detail. First, the organic layer 20 which is a feature of the present invention will be described in detail.

(Organic Layer)

The organic layer 20 includes an α-ray shielding agent having an α-ray shielding ability X of 0.50 or less.

The α-ray shielding ability of the α-ray shielding agent is calculated by the following method.

Method of calculating the α-ray shielding ability X: a laminate having a glass substrate and a layer which is composed of the α-ray shielding agent and is disposed on a surface of the glass substrate, and a glass substrate on which no layer being composed of the α-ray shielding agent is disposed are prepared, an amount A1 of α-ray in the laminate on the side of the layer being composed of the α-ray shielding agent and an amount A0 of α-ray in the glass substrate on which no layer being composed of the α-ray shielding agent is disposed are calculated using an α-ray measuring device, and the α-ray shielding ability X which is a ratio of the amount A1 of α-ray to the amount A0 of α-ray is calculated.

Hereinafter, the calculation method will be described in detail.

First, a laminate having a glass substrate and a layer (hereinafter, also referred to as a "specific layer") which is composed of the α-ray shielding agent and is disposed on a surface of the glass substrate, and a glass substrate (corresponding to an untreated glass substrate) on which the specific layer is not disposed are prepared.

The specific layer in the laminate is composed of the α-ray shielding agent. In other words, the specific layer is a layer substantially composed of only the α-ray shielding agent. The phrase "substantially composed of only the α-ray shielding agent" refers to an aspect that the content of the α-ray shielding agent is 99% by mass or more with respect to the total mass of the specific layer, and a trace of impurities (for example, solvent) may be included.

A method of forming the specific layer is not particularly limited, and examples thereof include a method of forming the specific layer on a glass substrate by contacting a composition which includes an α-ray shielding agent to be used and a solvent with the glass substrate. Examples of the contacting method include a method of applying the composition on the glass substrate. Examples of the solvent include a solvent which may be included in the composition for forming an organic layer described later.

In addition, as necessary, after contacting the composition with the glass substrate, the glass substrate on which the specific layer is disposed may be subjected to a drying treatment.

In addition, in a case where the α-ray shielding agent is an inorganic substance (for example, metal particles or metal oxide particles), the composition including the α-ray shielding agent and the solvent may further include a dispersing agent for improving dispersibility of the α-ray shielding agent which is the inorganic substance. In a case where the composition includes the dispersing agent, a coating film formed after contacting the composition with the glass substrate may be subjected to a baking treatment so that the dispersing agent does not remain in the formed specific layer, thereby removing the dispersing agent by decomposition. As conditions of the baking treatment, optimal conditions are selected depending on the type of the dispersing agent, but are preferably conditions of heating for 30 minutes or more at a temperature of 300° C. or higher.

The specific layer is formed on one main surface of the glass substrate.

The thickness of the specific layer is adjusted to 15.0±0.1 µm.

As the glass substrate included in the laminate, EAGLE XG 0.7 mm (manufactured by Corning Inc.) is used.

Next, the amount A1 of α-ray in the laminate on the side of the specific layer and the amount A0 of α-ray in the glass substrate on which the specific layer is not disposed are calculated using an α-ray measuring device.

As the α-ray measuring device, LACS-4000M (manufactured by Sumitomo Chemical Co., Ltd.) is used. Measurement conditions are as follows: applied voltage: 1.9 kV, PR-10 gas (argon:methane=9:1): 250 mL/min, effective count time: 20 h, sample area: 600 cm$^2$, and efficiency coefficient: 0.80.

In a case of measuring the amount A1 of α-ray in the laminate on the side of the specific layer, the measurement is performed by disposing a detector of the α-ray measuring device at a position facing the specific layer. That is, the amount A1 of α-ray is measured in a state that the specific layer is located between the glass substrate as the α-ray source and the detector.

The ratio (A1/A0) of the amount A1 of α-ray to the amount A0 of α-ray obtained is calculated and defined as the α-ray shielding ability X. α-ray shielding property of the α-ray shielding agent is excellent as long as the numerical value of the α-ray shielding ability X is smaller.

The thickness of the organic layer 20 is not particularly limited, but from the viewpoint that α-ray shielding property of the organic layer is more excellent, is preferably 3 µm or more and more preferably 5 µm or more. The upper limit of the thickness is preferably 30 µm or less and more preferably 20 µm or less from the viewpoint of reducing the height of the device.

The minimum transmittance of the organic layer 20 in a visible light region is not particularly limited, but from the viewpoint of easy incidence of light on the photoelectric conversion portion in the device, is preferably 70% or more, more preferably 80% or more, still more preferably 85% or more, particularly preferably 90% or more, and most preferably 95% or more. The upper limit is not particularly limited, but for example, is 100%.

The minimum transmittance in the visible light region refers to the minimum value (%) of the transmittance in the visible light region (wavelength of 400 to 700 nm).

As described above, the organic layer 20 includes the α-ray shielding agent (hereinafter, also referred to as a "specific α-ray shielding agent") having an α-ray shielding ability X of 0.50 or less.

The content of the specific α-ray shielding agent in the organic layer 20 is not particularly limited, but from the viewpoint that α-ray shielding property of the organic layer is more excellent, is preferably 30% by mass or more, more preferably 50% by mass or more, and still more preferably 70% by mass or more with respect to the total mass of the organic layer. The upper limit is not particularly limited, but for example, is 100% by mass.

The organic layer 20 includes at least an organic compound and may include an inorganic compound. From the viewpoint of handleability, the content of the organic compound in the organic layer 20 is preferably 15% by mass or more, more preferably 40% by mass or more, and still more preferably 80% by mass or more with respect to the total mass of the organic layer. The upper limit is not particularly limited, but for example, is 100% by mass.

As described later, in a case where the specific α-ray shielding agent is an inorganic compound, the organic layer 20 includes an organic compound in addition to the specific α-ray shielding agent.

The specific α-ray shielding agent may be either an organic compound or an inorganic compound, but is preferably an organic compound.

As the organic compound, a polymer is preferable from the viewpoint that α-ray shielding ability is more excellent.

The weight-average molecular weight of the polymer is not particularly limited, but from the viewpoint that a balance between the solvent resistance and solubility of the specific α-ray shielding agent is more excellent, is preferably 5,000 to 100,000 and more preferably 7,500 to 50,000.

In the present specification, the weight-average molecular weight (Mw) can be obtained, for example, using HLC-8220 (manufactured by Tosoh Corporation) as a determination device, TSKgel Super AWM-H (manufactured by Tosoh Corporation, 6.0 mmID (inner diameter)×15.0 cm) as a column, and a 10 mmol/L of lithium bromide N-methylpyrrolidinone (NMP) solution as an eluent.

The density of the specific α-ray shielding agent is not particularly limited, but from the viewpoint that α-ray shielding property of the organic layer is more excellent, is preferably 1.4 g/cm$^3$ or more and more preferably 1.5 g/cm$^3$ or more. The upper limit of the density is not particularly limited, but is usually 6.0 g/cm$^3$ or less.

The density of the specific α-ray shielding agent is calculated by a gas-phase substitution method. Specifically, a solid sample of the specific α-ray shielding agent is prepared, and the density is evaluated using Pentapyc 5200e (manufactured by Quantachrome Instruments Japan G. K.).

From the viewpoint that α-ray shielding property of the organic layer is more excellent, the specific α-ray shielding agent preferably includes atoms having a first ionization potential of more than 1000 kJ/mol and more preferably includes atoms having a first ionization potential of 1500 kJ/mol or more. The upper limit value of the first ionization potential is not particularly limited, but from the viewpoint of easy synthesis of the α-ray shielding agent, is preferably 2000 kJ/mol or less.

As the atom, a halogen atom (fluorine atom, chlorine atom, bromine atom, and iodine atom), an oxygen atom, or a nitrogen atom is preferable, and a halogen atom or an oxygen atom is more preferable.

From the viewpoint that α-ray shielding property of the organic layer is more excellent, the specific α-ray shielding agent preferably includes atoms in which a ratio of electron numbers to a covalent radius is more than 10 Å$^{-1}$, more preferably includes atoms in which the ratio of electron numbers to a covalent radius is 15 Å$^{-1}$ or more, and still more preferably includes atoms in which the ratio of electron numbers to a covalent radius is 20 Å$^{-1}$ or more. The upper limit value of the ratio of electron numbers to a covalent radius is not particularly limited, but from the viewpoint of easy synthesis of the specific α-ray shielding agent, is preferably 50 Å$^{-1}$ or less.

As the atom, a fluorine atom, a bromine atom, an iodine atom, a titanium atom, a gallium atom, a germanium atom, a nickel atom, or a zinc atom is preferable.

From the viewpoint that α-ray shielding property of the organic layer is more excellent, an ionization potential parameter (hereinafter, also referred to as "IPP") of the specific α-ray shielding agent is preferably 7000 kJ/molÅ (kJ/(mol·Å)) or more and more preferably 9000 kJ/molÅ or more. The upper limit of IPP is not particularly limited, but is usually 25000 kJ/molÅ or less.

IPP of the specific α-ray shielding agent is a value which is a sum of calculation values of each atom included in the specific α-ray shielding agent, the calculation value is calculated by multiplying IPP of the each atom by the content molar ratio of the each atom. IPP of an atom is a value ((first ionization potential of atom)×(ratio of electron numbers to covalent radius of atom)) obtained by multiplying the first ionization potential (kJ/mol) of the atom by the ratio of electron numbers to a covalent radius (Å) of the atom.

For example, in a case where the specific α-ray shielding agent includes a carbon atom, an oxygen atom, and an iodine atom, and the content molar ratios (number of moles of specific atom/total number of moles of all atoms) of the atoms to the total number of moles of all atoms are respectively 0.8, 0.1, and 0.1, the ionization potential parameter of the specific α-ray shielding agent is calculated by the following equation.

IPP of specific α-ray shielding agent={(IPP of carbon atom×0.8)+(IPP of oxygen atom×0.1)+(IPP of iodine atom×0.1)}

As the first ionization potential of an atom, a numerical value described in Chemical Handbook (Basic Edition, Maruzen) is used. In addition, as the covalent radius of an atom, a numerical value described in R. T. Sanderson in Chemical Periodicity, Reinhold, New York, USA, 1962. is used. As the covalent radius of an atom, a covalent radius in a case of a single bond is used.

Normally, α-ray collides with an electron in an atom and is attenuated by ejecting the electron (ionizing the atom). In the calculation of IPP, the first ionization potential of an atom indicates the energy (difficulty of ionizing the atom) required to eject the electron, the ratio of electron numbers to a covalent radius (Å) of the atom indicates a collision frequency with the electron, and a larger IPP of the product of these values indicates that α-ray is easily attenuated.

In a case where the specific α-ray shielding agent is a polymer, IPP of the specific α-ray shielding agent is a value which is a sum of calculation values of each repeating unit, the calculation value is calculated by obtaining IPP of the each repeating unit and multiplying IPP of the each repeating unit by the content molar ratio of the each repeating unit to all units.

For example, in a case where the specific α-ray shielding agent is a polymer including a unit A and a unit B, and the content molar ratios (number of moles of each unit/total number of moles of all units) of the unit A and the unit B are respectively 0.4 and 0.6, IPP of the specific α-ray shielding agent is calculated by the following equation.

IPP of specific α-ray shielding agent={(IPP of unit A×0.4)+(IPP of unit B×0.6)}

IPP of the unit A and the unit B is a value which is a sum of calculation values of each atom constituting the each unit, the calculation value is calculated by multiplying IPP of the each atom by the content molar ratio of the each atom.

The refractive index of the specific α-ray shielding agent at a wavelength of 589.3 nm is not particularly limited, but from the viewpoint of electron density, is preferably 1.7 or more and more preferably 1.8 or more. The upper limit is not particularly limited, but is usually 3.0 or less.

Examples of a method of measuring the refractive index of the specific α-ray shielding agent include a method of forming a single film being composed of the specific α-ray shielding agent on a silicon substrate and measuring the refractive index using an ellipsometer. Specifically, in the same manner as the method of calculating the α-ray shielding ability X, an 100 nm of layer being composed of the α-ray shielding agent is formed on a silicon substrate, and the refractive index of the obtained layer is measured using an ellipsometry (Lambda Ace RE-3300 (trade name), manufactured by Dainippon Screen Mfg. Co., Ltd.) and defined as the refractive index of the specific α-ray shielding agent.

As described above, the specific α-ray shielding agent is preferably a polymer (hereinafter, also simply referred to as a "specific polymer") exhibiting a predetermined α-ray shielding ability X, and it is preferable that the density, IPP, and refractive index of the specific polymer are within the above-described suitable ranges.

In addition, the specific polymer preferably includes atoms having a first ionization potential of more than 1000 kJ/mol.

In addition, the specific polymer preferably includes atoms in which the above-described ratio of electron numbers to a covalent radius is 10 Å$^{-1}$ or more.

The specific α-ray shielding agent preferably includes a halogen atom. Examples of the halogen atom include a fluorine atom, a chlorine atom, a bromine atom, and an iodine atom.

The content of the halogen atom in the specific α-ray shielding agent is not particularly limited, but from the viewpoint that α-ray shielding property of the organic layer is more excellent, is preferably 10 mol % or more and more preferably 15 mol % or more with respect to the total moles of the specific α-ray shielding agent. The upper limit is not particularly limited, but is preferably 75 mol % or less.

In a case where the specific α-ray shielding agent is the specific polymer, it is preferable that the specific polymer includes a repeating unit (hereinafter, also simply referred to as a "specific unit") including a halogen atom.

The structure of the specific unit is not particularly limited, but is preferably a unit represented by Formula (1).

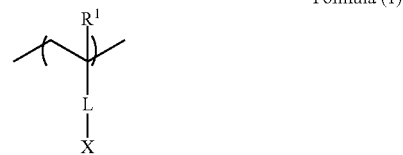

Formula (1)

In Formula (1), $R^1$ represents a hydrogen atom or an alkyl group.

L represents a single bond or a divalent linking group. Examples of the divalent linking group include an ether group (—O—), a carbonyl group (—CO—), an ester group (—COO—), an amide group (—CONH—), a thioether group (—S—), —SO$_2$—, —NR$^4$— (R$^4$ represents a hydrogen atom or an alkyl group), a divalent hydrocarbon group (for example, an alkylene group, an alkenylene group, an alkynylene group, and an arylene group), and a group of a combination of these groups.

X represents a hydrocarbon group having a halogen atom or a group represented by Formula (2). In Formula (2), * represents a bonding site.

Formula (2)

Examples of the hydrocarbon group having a halogen atom include an alkyl group having a halogen atom, an alkenyl group having a halogen atom, an alkynyl group having a halogen atom, an aryl group having a halogen atom, and a group of a combination of these groups. Among these, from the viewpoint of easy synthesis of the specific polymer, an aryl group having a halogen atom is preferable.

Each $R^2$ independently represents a hydrogen atom or an alkyl group. The number of carbon atoms of the alkyl group is preferably 1 to 10 and more preferably 1 to 4.

$A^-$ represents an anion including a halogen atom. It is sufficient that the anion includes a halogen atom, and the anion may be a halogen anion ($F^-$, $Cl^-$, $Br^-$, and $I^-$). Examples of the anion represented by $A^-$ include $F^-$, $Cl^-$, $Br^-$, $I^-$, an anion of perhalogenated Lewis acid (for example, $PF_6^-$, $SbF_6^-$, $BF_4^-$, $AsF_6^-$, and $FeCl_4^-$), and an anion of perhalic acid (for example, $ClO_4^-$, $BrO_4^-$, and $IO_4^-$).

The content of the specific unit in the specific polymer is not particularly limited, but from the viewpoint that α-ray shielding property of the organic layer is more excellent, is preferably 25% by mass or more and more preferably 50% by mass or more with respect to all units in the specific polymer. The upper limit is not particularly limited, but is usually 100% by mass or less.

The specific polymer may include another unit in addition to the specific unit, and may include a unit not including a halogen atom.

In a case where the specific α-ray shielding agent is an inorganic compound, metal particles or metal oxide particles (hereinafter, also collectively referred to as "specific particles") having a density of 4.0 g/cm³ or more are preferable as the inorganic compound.

The density of the specific particles is more preferably 4.0 to 6.0 g/cm³.

The density of the specific particles is calculated by the above-described gas-phase substitution method.

The diameter of the specific particles is not particularly limited, but is preferably 50 nm or less.

The type of metal atom included in the specific particles is not particularly limited, but an atom in which the ratio of electron numbers to a covalent radius is 10 $Å^{-1}$ or more is preferable.

IPP of the specific particles is preferably 7000 kJ/molÅ or more, and the more suitable range is as described above.

The organic layer 20 may include other components in addition to the specific α-ray shielding agent.

Examples of the other components include a binder resin, a surfactant, a coloring agent, an ultraviolet absorbing agent, an antioxidant, and a filler.

Examples of the binder resin include a known resin in which the above-described α-ray shielding ability X is more than 0.50. The binder resin may be a resin formed by polymerizing a polymerizable compound which is included in the composition for forming an organic layer used at the time of forming the organic layer 20 described later.

Examples of the binder resin include a (meth)acrylic resin, a (meth)acrylamide resin, a (meth)acrylic/(meth)acrylamide copolymer resin, an epoxy resin, a polystyrene resin, and a polyimide resin.

The binder resin may be an alkali-soluble resin. The alkali-soluble resin refers to a resin which dissolves in an alkaline solution.

With regard to a specific aspect of the alkali-soluble resin, paragraphs 0146 to 0162 of WO2016/190162A can be referenced, and the contents thereof are incorporated herein.

Examples of the surfactant include a known surfactant such as a fluorine-based surfactant, a nonionic surfactant, a cationic surfactant, an anionic surfactant, and a silicone-based surfactant, and a fluorine-based surfactant is preferable.

The fluorine content in the fluorine-based surfactant is preferably 3% to 40% by mass and more preferably 5% to 30% by mass.

With regard to a specific aspect of the surfactant, paragraphs 0261 to 0265 of WO2016/190162A can be referenced, and the contents thereof are incorporated herein.

Examples of the coloring agent include a known coloring agent such as a white coloring agent, a black coloring agent, and a chromatic coloring agent. The chromatic coloring agent means a coloring agent other than the white coloring agent and the black coloring agent.

The coloring agent may be either a pigment or a dye.

Examples of the white coloring agent include titanium oxide.

Examples of the black coloring agent include carbon black and titanium black.

With regard to a specific aspect of the chromatic coloring agent, paragraphs 0062 to 0067 of WO2016/186050A can be referenced, and the contents thereof are incorporated herein.

Examples of the ultraviolet absorbing agent include a known ultraviolet absorbing agent, preferably a conjugated diene compound.

With regard to a specific aspect of the ultraviolet absorbing agent, paragraphs 0222 to 0225 of WO2016/186050A can be referenced, and the contents thereof are incorporated herein.

Examples of the antioxidant include a known antioxidant such as a phenol compound, a phosphite compound, a thioether compound, and a hindered amine compound.

With regard to a specific aspect of the antioxidant, paragraphs 0228 to 0235 of WO2016/186050A can be referenced, and the contents thereof are incorporated herein.

With regard to a specific aspect of the filler, paragraph 0227 of WO2016/186050A can be referenced, and the contents thereof are incorporated herein.

A method of forming the organic layer 20 is not particularly limited, and examples thereof include a known method.

For example, the method includes a method of forming a coating film by contacting a composition for forming an organic layer, which includes the specific α-ray shielding agent, with a predetermined base material, and performing a curing treatment as necessary.

Hereinafter, the procedure of the method will be described in detail.

The aspect of the specific α-ray shielding agent included in the composition for forming an organic layer is as described above.

The content of the specific α-ray shielding agent in the composition for forming an organic layer is not particularly limited, but from the viewpoint that α-ray shielding property of the organic layer is more excellent, is preferably 30% by mass or more, more preferably 50% by mass or more, and still more preferably 70% by mass or more with respect to the total solid content of the composition for forming an organic layer. The upper limit is not particularly limited, but for example, is 100% by mass.

The total solid content refers to components, except for the solvent, forming the organic layer.

The composition for forming an organic layer may include other components in addition to the specific α-ray shielding agent. As described above, examples of the other components include a binder resin, a surfactant, a coloring agent, an ultraviolet absorbing agent, an antioxidant, and a filler.

In addition, examples of the other components include a polymerizable compound, a polymerization initiator, a polymerization inhibitor, a substrate adhesion agent, and a solvent.

Examples of the polymerizable compound include a known polymerizable compound such as a compound having a group having an ethylenically unsaturated bond, a compound having an epoxy group, and a compound having an alkoxysilyl group. Examples of the group having an ethylenically unsaturated bond include a vinyl group, a (meth)allyl group, and a (meth)acryloyl group.

As the polymerizable compound, a radically polymerizable compound is preferable.

As the polymerizable compound, a polyfunctional polymerizable compound having a plurality of polymerizable groups is preferable.

Specific examples of the polymerizable compound include dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA; manufactured by Nippon Kayaku Co., Ltd., A-DPH-12E; manufactured by Shin-Nakamura Chemical Co., Ltd.), and a compound having a structure in which these (meth)acryloyl groups are through an ethylene glycol residue or a propylene glycol residue (for example, SR454 and SR499 which are commercially available products from Sartomer). In addition, examples thereof include NK ESTER A-TMMT (pentaerythritol tetraacrylate, manufactured by Shin-Nakamura Chemical Co., Ltd.) and KAYARAD RP-1040 (manufactured by Nippon Kayaku Co., Ltd.).

With regard to a specific aspect of the compound having an epoxy group, paragraphs 0043 to 0071 of JP2015-151467A can be referenced, and the contents thereof are incorporated herein.

With regard to a specific aspect of the compound having an alkoxysilyl group, paragraphs 0139 to 0141 of WO2016/158819A can be referenced, and the contents thereof are incorporated herein.

In addition to the above-described compounds, with regard to a specific aspect of the polymerizable compound, paragraphs 0168 to 0194 of WO2016/190162A can be referenced, and the contents thereof are incorporated herein.

The content of the polymerizable compound in the composition for forming an organic layer is preferably 0% by 50% by mass and more preferably 5% to 45% by mass with respect to the total solid content of the composition for forming an organic layer.

Examples of the polymerization initiator include a known polymerization initiator, and a photopolymerization initiator is preferable.

It is preferable that the photopolymerization initiator has photosensitivity to any light within a region from ultraviolet light to visible light.

As the type of the photopolymerization initiator, an optimum compound is selected depending on the polymerization type of the polymerizable compound, and examples thereof include a photopolymerization initiator which initiates radical polymerization and a photopolymerization initiator which initiates cationic polymerization.

From the viewpoint of higher sensitivity, an oxime ester-based polymerization initiator (oxime compound) is preferable as the photopolymerization initiator. Examples of a commercially available product of the oxime ester-based polymerization initiator include IRGACURE-OXE01 (manufactured by BASF), IRGACURE-OXE02 (manufactured by BASF), IRGACURE-OXE03 (manufactured by BASF), and IRGACURE-OXE04 (manufactured by BASF).

With regard to a specific aspect of the polymerization initiator, paragraphs 0206 to 0237 of WO2016/190162A can be referenced, and the contents thereof are incorporated herein.

The content of the polymerization initiator in the composition for forming an organic layer is preferably 0% by 10% by mass and more preferably 0.5% to 8% by mass with respect to the total solid content of the composition for forming an organic layer.

Examples of the polymerization inhibitor include a known polymerization inhibitor such as a phenolic hydroxyl group-containing compound, N-oxide compound, and a piperidine-1-oxyl free radical compound.

With regard to a specific aspect of the polymerization inhibitor, paragraph 0197 of WO2016/186050A can be referenced, and the contents thereof are incorporated herein.

Examples of the substrate adhesion agent include a known substrate adhesion agent, preferably a silane-based coupling agent, a titanate-based coupling agent, and an aluminum-based coupling agent.

With regard to a specific aspect of the substrate adhesion agent, paragraphs 0199 to 0208 of WO2016/186050A can be referenced, and the contents thereof are incorporated herein.

Examples of the solvent include a known solvent, and an organic solvent is preferable.

Examples of the organic solvent include esters, ethers, ketones, and aromatic hydrocarbons.

With regard to a specific aspect of the organic solvent, paragraphs 0190 and 0191 of WO2016/186050A can be referenced, and the contents thereof are incorporated herein.

A solvent having a small metal content is preferable as the solvent, and the metal content in the solvent is preferably 10 ppb (parts per billion) by mass or less. A solvent in which the metal content is at a level of ppt (parts per trillion) by mass may be used as necessary, and such a high-purity solvent is provided by, for example, Toyo Kasei Kogyo Co., Ltd. (The Chemical Daily, Nov. 13, 2015).

In a case where the composition for forming an organic layer includes a surfactant, the content of the surfactant is preferably 0.01% to 0.1% by mass with respect to the total amount of the composition for forming an organic layer.

The content of the organic substance in the composition for forming an organic layer is preferably 15% by mass or more, more preferably 40% by mass or more, and still more preferably 80% by mass or more with respect to the total solid content. The upper limit is not particularly limited, but for example, is 100% by mass.

A method of preparing the composition for forming an organic layer is not particularly limited, and the above-described components may be mixed at once or may be mixed separately.

In the preparation of the composition, for the purpose of removing foreign substances, reducing defects in the organic layer, and the like, it is preferable to filter the composition for forming an organic layer with a filter. The filter is not particularly limited as long as a filter used for filtration in the related art. Examples of the filter include a filter using a material such as a fluororesin (for example, polytetrafluoroethylene), a polyamide-based resin (for example, nylon, more specifically, nylon-6 and nylon-6,6), and a polyolefin resin (for example, polyethylene and polypropylene).

Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is within the above-mentioned range, fine foreign substances can be reliably removed. It is also preferable to use a fibrous filter material. Examples of the fibrous filter material include a polypropylene fiber, a nylon fiber, and a glass fiber.

In a case of using a filter, different filters (for example, a first filter and a second filter) may be combined. In that case, the filtration with each of the filters may be performed only once or may be performed twice or more times. In addition, filters having different pore sizes within the above-mentioned range may be combined. With regard to the pore size of the filter herein, reference can be made to nominal values of filter manufacturers. A commercially available filter can be selected from, for example, various filters provided by Nihon Pall Corporation (DFA4201NXEY), Toyo Roshi Kaisha., Ltd., Nihon Entegris K. K. (formerly Nippon Microlith Co., Ltd.), and Kitz Micro Filter Corporation.

Examples of the base material contact with the composition for forming an organic layer include the glass substrate described later. That is, the organic layer can be directly formed on the glass substrate using the composition for forming an organic layer.

As the base material, a so-called release base material may be used.

A method of contacting the composition for forming an organic layer with the base material is not particularly limited, and examples thereof include a method of applying the composition for forming an organic layer on the base material and a method of immersing the base material in the composition for forming an organic layer.

After contacting the composition for forming an organic layer with the base material, as necessary, a curing treatment may be performed to the coating film formed on the base material. In particular, in a case where the composition for forming an organic layer includes a polymerizable compound, it is preferable to perform the curing treatment to the coating film to polymerize the polymerizable compound.

Examples of the curing treatment include a light curing treatment and a heat curing treatment. As conditions of these treatments, optimal conditions are selected depending on the types of components in the composition for forming an organic layer to be used.

In addition, after contacting the composition for forming an organic layer with the base material or after the curing treatment, as necessary, a drying treatment for drying the coating film may be performed.

(Solid-State Imaging Element)

The solid-state imaging element 12 is an element which receives light by a photoelectric conversion portion, performs photoelectric conversion, and outputs an image signal.

As the solid-state imaging element 12, a known solid-state imaging element can be used. In the solid-state imaging element 12, a plurality of photoelectric conversion portions are usually disposed two-dimensionally, and a color filter 14 and a microlens 16, which will be described later, are provided so as to correspond to the respective photoelectric conversion portions.

The configuration of the photoelectric conversion portion is not particularly limited, and examples thereof include a photoelectric conversion portion formed by a p-n junction.

In addition, typical examples of the solid-state imaging element 12 include a semiconductor substrate on which an image conversion portion, a control circuit for controlling the image conversion portion, and the like are formed. Examples of the semiconductor substrate include a silicon substrate formed of silicon.

Figure 2:
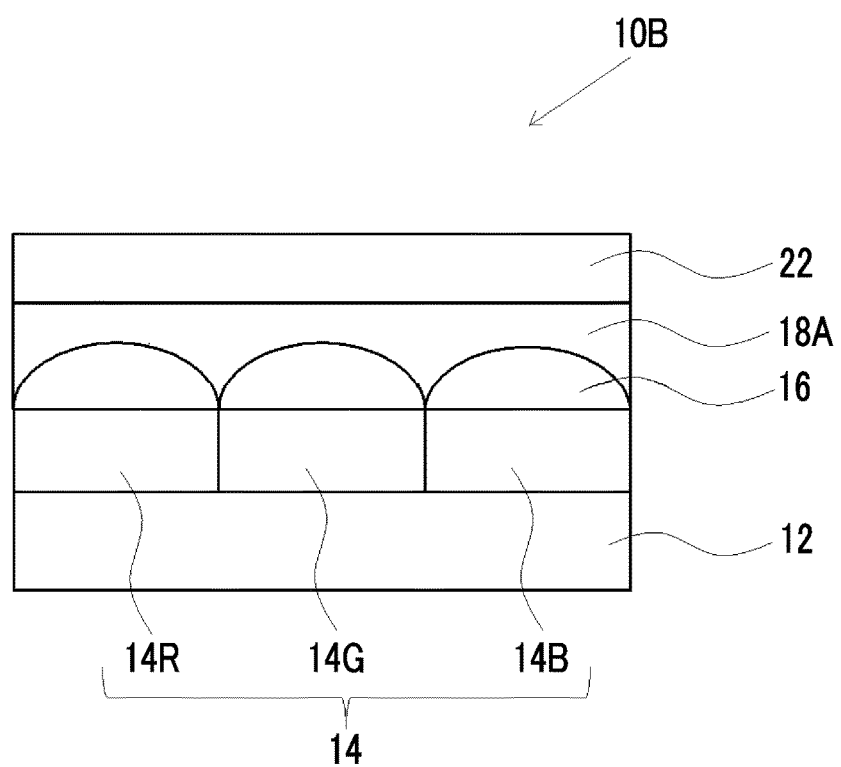
FIG. 2 is a cross-sectional view illustrating another embodiment of a solid-state imaging device which is a device of the present invention.
Figure 9:
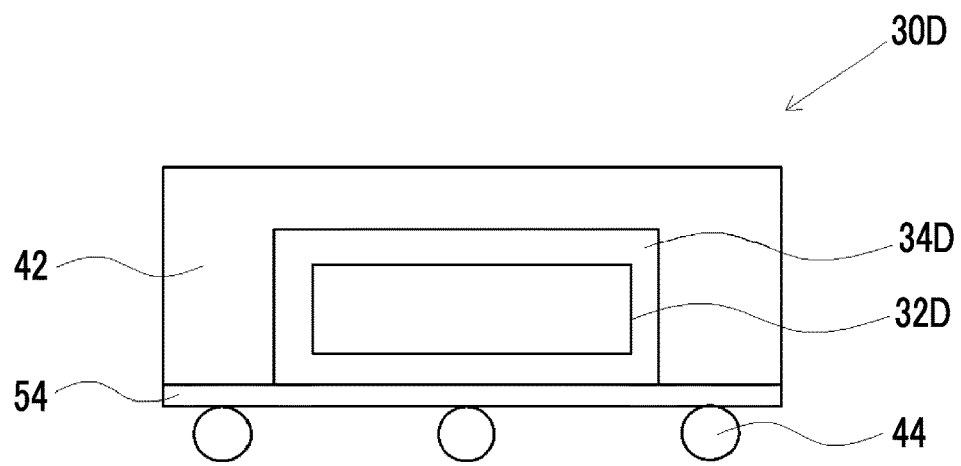
FIG. 9 is a cross-sectional view illustrating another embodiment of an electronic module which is a device of the present invention.

Specific examples of an aspect of the solid-state imaging element include the solid-state imaging element shown in FIG. 2 of JP2016-102211A and the solid-state imaging element shown in FIG. 9 of JP2016-001681A, and the contents thereof are incorporated herein.

(Color Filter)

The color filter 14 is a layer disposed between the solid-state imaging element 12 and the microlens 16.

In FIG. 1, the color filter 14 includes a red color filter 14R, a green color filter 14G, and a blue color filter 14B. The respective color filters are partitioned by a black matrix (not shown).

Examples of the color filter 14 include a known color filter. In addition, as a coloring agent included in the color filter, a known coloring agent is used.

With regard to a specific aspect of the color filter 14, paragraphs 0214 to 0263 of JP2014-043556A can be referenced, and the contents thereof are incorporated herein.

The solid-state imaging device 10A of FIG. 1 has three color filters of the red color filter 14R, the green color filter 14G, and the blue color filter 14B, but the present invention is not limited to this aspect and may have a color filter of other colors.

(Microlens)

The microlens 16 is disposed on the color filter 14 and has a function of condensing incident light of the solid-state imaging device 10A.

The refractive index of the microlens 16 is not particularly limited, but from the viewpoint that light condensing effect is more excellent, it is preferable that the refractive index at a wavelength of 589.3 nm is 1.70 or more. The upper limit is not particularly limited, but is usually 3.00 or less.

The type of a resin constituting the microlens 16 is not particularly limited, and examples thereof include a known resin.

(Transparent Resin Layer)

The transparent resin layer 18 is a layer disposed on the microlens 16 so as to cover the microlens 16, and the surface thereof is flattened. That is, the transparent resin layer 18 also has a function as a so-called flattening layer.

The refractive index of the transparent resin layer 18 is not particularly limited, but from the viewpoint that light condensing effect is more excellent, the refractive index at a wavelength of 589.3 nm is preferably 1.50 or less. The lower limit is not particularly limited, but is usually 1.00 or more.

The type of a resin constituting the transparent resin layer 18 is not particularly limited, and examples thereof include a known resin.

(Glass Substrate)

The type of the glass substrate 22 is not particularly limited as long as the substrate functions as a cover glass.

Examples of a material constituting the glass substrate 22 include quartz glass and borosilicate glass.

In FIG. 1, the transparent resin layer 18 and the organic layer 20 are in contact with each other, but an adhesive layer may be disposed between the transparent resin layer 18 and the organic layer 20 in order to increase adhesiveness therebetween.

In addition, in FIG. 1, the organic layer 20 and the glass substrate 22 are in contact with each other, but an adhesive layer may be disposed between the organic layer 20 and the glass substrate 22 in order to increase adhesiveness therebetween.

Examples of the adhesive layer include a known adhesive layer.

In addition, the above-described organic layer 20 itself may have adhesiveness. In this case, the organic layer 20 functions as a layer having α-ray shielding property and also functions as an adhesive layer.

In addition, the solid-state imaging device 10A of FIG. 1 includes the microlens 16, but the microlens 16 and the transparent resin layer 18 may be removed depending on use.

In addition, in the solid-state imaging device 10A of FIG. 1, the transparent resin layer 18 and the organic layer 20 are in contact with each other, but by using a predetermined holding device, the transparent resin layer 18 and the organic layer 20 may be disposed apart from each other. Also in this aspect, the microlens 16 and the transparent resin layer 18 may be removed depending on use.

In FIG. 1, the solid-state imaging device 10A includes the organic layer 20 including the specific α-ray shielding agent, but the present invention is not limited to this aspect. In the solid-state imaging device, another aspect may be used as long as the specific α-ray shielding agent is located between the glass substrate as the α-ray source and the solid-state imaging element as the electronic circuit.

For example, as shown in FIG. 2, a solid-state imaging device 10B includes a solid-state imaging element 12 having a photoelectric conversion portion (not shown), a color filter 14, a microlens 16, a transparent resin layer 18A including the specific α-ray shielding agent, and a glass substrate 22 in this order.

In the above-mentioned aspect, the same constitutional members as those in the aspect of FIG. 1 are denoted by the same reference mark.

The difference between the solid-state imaging device 10A and the solid-state imaging device 10B is that, for example, the solid-state imaging device 10B does not include the organic layer 20 and the transparent resin layer 18A includes the specific α-ray shielding agent.

In this aspect, the transparent resin layer 18A including the specific α-ray shielding agent corresponds to the organic layer of the present invention. That is, the transparent resin layer 18A in FIG. 2 has two functions as the organic layer and the flattening layer.

The solid-state imaging device 10B shown in FIG. 2 has an aspect that the transparent resin layer 18A includes the specific α-ray shielding agent, but the present invention is not limited to this aspect. For example, at least one of the microlens or the color filter may include the specific α-ray shielding agent.

Furthermore, the solid-state imaging device of the present invention may be an aspect of having an infrared cut filter and an infrared transmission filter.

Figure 3:
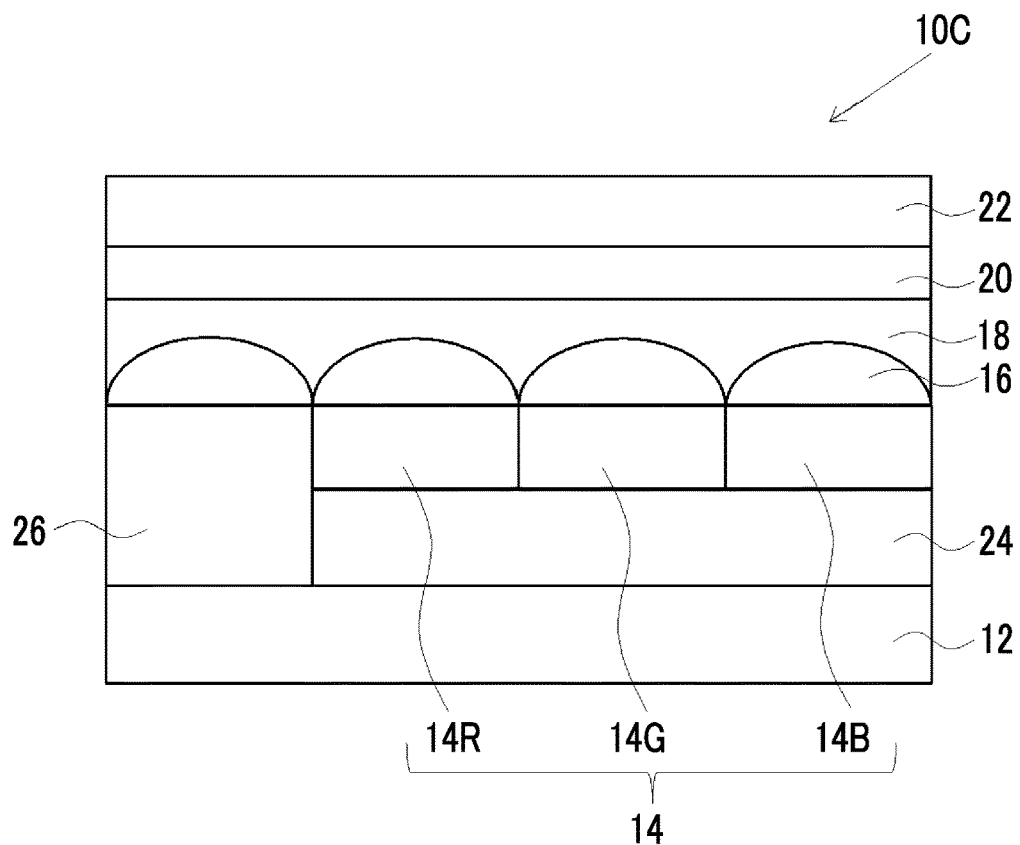
FIG. 3 is a cross-sectional view illustrating another embodiment of a solid-state imaging device which is a device of the present invention.

Specifically, as shown in FIG. 3, in a solid-state imaging device 10C, an infrared cut filter 24 and an infrared transmission filter 26 are disposed on a solid-state imaging element 12 having a photoelectric conversion portion (not shown). In addition, a color filter 14 is disposed on the infrared cut filter 24. Furthermore, on the color filter 14 and the infrared transmission filter 26, a microlens 16, a transparent resin layer 18, an organic layer 20 including the specific α-ray shielding agent, and a glass substrate 22 are disposed in this order.

In the above-mentioned aspect, the same constitutional members as those in the aspect of FIG. 1 are denoted by the same reference mark.

The difference between the solid-state imaging device 10A and the solid-state imaging device 10C is that, for example, the solid-state imaging device 10C includes the infrared cut filter 24 and the infrared transmission filter 26. Since the solid-state imaging device 10C includes the infrared cut filter 24 and the infrared transmission filter 26, the solid-state imaging device 10C can also sense infrared rays.

In the aspect of FIG. 3, the positions of the infrared cut filter 24 and the color filter 14 may be reversed.

With regard to a specific aspect of the infrared cut filter 24, paragraphs 0011 to 0285 of WO2016/186050A and paragraphs 0015 to 0293 and 0297 of WO2016/190162A can be referenced, and the contents thereof are incorporated herein.

With regard to a specific aspect of the infrared transmission filter 26, paragraphs 0291 to 0303 of WO2016/186050A can be referenced, and the contents thereof are incorporated herein.

Second Embodiment

Another embodiment of the device according to the embodiment of the present invention includes an electronic module (electronic component module). The electronic module is a member in which an electronic circuit such as a logic circuit, a storage circuit, and a communication circuit described later is packaged. That is, in a case where an electronic circuit is composed of a semiconductor chip or the like, the electronic module corresponds to a so-called semiconductor package.

Embodiment A

Figure 4:
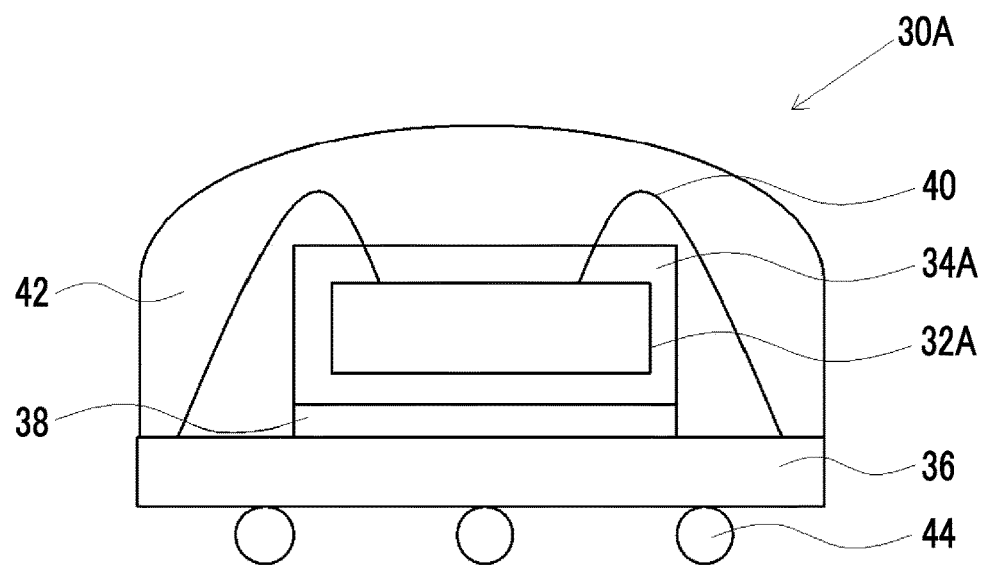
FIG. 4 is a cross-sectional view illustrating an embodiment of an electronic module which is a device of the present invention.

FIG. 4 shows an aspect of the second embodiment of the device according to the embodiment of the present invention.

The device shown in FIG. 4 is an electronic module 30A, and the electronic module 30A includes an electronic circuit 32A, an organic layer 34A including the specific α-ray shielding agent, a wiring board 36, an adhesive layer 38, a bonding wire 40, a mold 42, and a solder ball 44.

The electronic module 30A has a so-called wire bonding structure.

As described later, the mold 42 may include a filler.

In the electronic module 30A, a filler which may be included in the solder ball 44 and mold 42 can be the α-ray source.

The electronic module 30A is mounted on a printed wiring board or the like through the solder ball 44.

Hereinafter, each member constituting the electronic module 30A will be described in detail.

The electronic circuit 32A corresponds to a so-called integrated circuit and can be formed using a plurality of elements such as a transistor, a resistor, and a capacitor. As the element, for example, a semiconductor element is used. An electronic circuit formed using a plurality of the semiconductor element is also called a semiconductor chip.

The type of the electronic circuit 32A is not particularly limited, and examples thereof include a logic circuit, a storage circuit, and a communication circuit. The configuration of these circuits is not particularly limited, and examples thereof include a known circuit.

The electronic circuit 32A usually has electrodes (not shown in FIG. 4) for electrically connecting to the outside. In FIG. 4, the electronic circuit 32A has electrodes (not shown) on a surface opposite to the wiring board 36, and the electrodes are connected to the bonding wire 40 described later.

The organic layer 34A is a layer disposed so as to cover the electronic circuit 32A. By disposing the organic layer 34A, it is possible to suppress α-ray emitted from the α-ray source from reaching the electronic circuit 32A.

However, in FIG. 4, the organic layer 34A is not disposed on an electrode portion (not shown) of the electronic circuit 32A, and as described above, the electrode portion is in contact with the bonding wire 40 and electrically connected.

The organic layer 34A includes the specific α-ray shielding agent. The aspect of the specific α-ray shielding agent is as described above.

The content of the specific α-ray shielding agent in the organic layer 34A is not particularly limited, but from the viewpoint that α-ray shielding property of the organic layer is more excellent, is preferably 30% by mass or more, more preferably 50% by mass or more, and still more preferably 70% by mass or more with respect to the total mass of the organic layer. The upper limit is not particularly limited, but for example, is 100% by mass.

The organic layer 34A includes at least an organic compound and may include an inorganic compound. From the viewpoint of handleability, the content of the organic compound in the organic layer 34A is preferably 15% by mass or more, more preferably 40% by mass or more, and still more preferably 80% by mass or more with respect to the total mass of the organic layer. The upper limit is not particularly limited, but for example, is 100% by mass.

In a case where the specific α-ray shielding agent is an inorganic compound, the organic layer 34A includes an organic compound in addition to the specific α-ray shielding agent.

From the viewpoint that α-ray shielding property of the organic layer is more excellent, the thickness of the organic layer 34A is preferably 5 µm or more and more preferably 10 µm or more. The upper limit of the thickness is preferably 30 µm or less and more preferably 20 or less from the viewpoint of heat radiation property.

A method of forming the organic layer 34A is not particularly limited, and examples thereof include a known method. For example, the method includes a method of contacting the above-mentioned composition for forming an organic layer with the electronic circuit 32A and performing a curing treatment as necessary.

Examples of a method of securing connectivity between the electronic circuit 32A and the bonding wire 40 described later include a method of removing an organic layer on the electrode portion of the electronic circuit 32A, which is connected to the bonding wire, after contacting the composition for forming an organic layer with the electronic circuit 32A. Examples of the removing method include a method using a laser.

The wiring board 36 is a substrate electrically connected to the electronic circuit 32A through the bonding wire 40 described later.

The wiring board 36 usually has at least an electrode portion electrically connected to the electronic circuit 32A, an electrode portion electrically connected to the solder ball 44 described later, and a circuit pattern.

The circuit pattern is usually composed of a laminate structure of an insulating layer being composed of a resin, glass, a semiconductor material, and a composite material thereof, and a wiring pattern being composed of a metal such as copper, gold, silver, and aluminum.

As the configuration of the wiring board 36, an optimal configuration is appropriately selected depending on use.

The adhesive layer 38 is a layer disposed between the electronic circuit 32A and the wiring board 36 in order to improve adhesiveness therebetween.

Examples of the adhesive layer 38 include a known adhesive layer.

The bonding wire 40 is a wire for electrically connecting the electronic circuit 32A and the wiring board 36.

The material constituting the bonding wire 40 is not particularly limited, and examples thereof include gold.

Examples of a method of forming the bonding wire 40 include a known method.

The mold 42 is a member disposed so as to cover the electronic circuit 32A.

The mold 42 is usually composed of a resin. The type of the resin used for producing the mold 42 is not particularly limited, and examples thereof include an epoxy resin.

A filler may be included in the mold 42, and examples of the filler include silica. As described above, silica can be the α-ray source.

The solder ball 44 is electrically connected to the wiring board 36 and disposed on a surface of the wiring board 36 opposite to a surface of the wiring board 36 on the side of the electronic circuit 32A.

The solder ball 44 is in contact with the electrode portion (not shown in FIG. 4) disposed on the surface of the wiring board 36 opposite to the surface of the wiring board 36 on the side of the electronic circuit 32A, and is electrically connected to the wiring board 36. That is, the solder ball 44 is electrically connected to the electronic circuit 32A through the wiring board 36 and the bonding wire 40.

The configuration of the solder ball 44 is not particularly limited, and examples thereof include a known solder ball such as a solder ball including tin, silver, copper, or the like. As described above, the solder ball 44 can be the α-ray source.

Examples of a method of installing the solder ball 44 include a known method, and the method includes a method of applying flux or the like on electrodes (not shown) of the wiring board 36, installing the solder ball, and then heating.

In FIG. 4, the organic layer 34A is disposed so as to cover the substantially entire surface (an area other than an area connected to the bonding wire) of the electronic circuit 32A, but the present invention is not limited to this aspect and it is sufficient that the organic layer 34A is disposed so as to cover at least a part of the electronic circuit.

In the present invention, the organic layer is preferably disposed so as to cover at least a part of the surface of the electronic circuit other than the electrode portion, and is more preferably disposed so as to cover the entire surface of the electronic circuit other than the electrode portion.

In addition, in the electronic module 30A of FIG. 4, at least one of the adhesive layer 38 or the mold 42 may further include the specific α-ray shielding agent.

Furthermore, the electronic module 30A of FIG. 4 includes the organic layer 34 including the specific α-ray shielding agent, but the aspect is not limited as long as the organic layer including the specific α-ray shielding agent is included in the electronic module.

Figure 5:
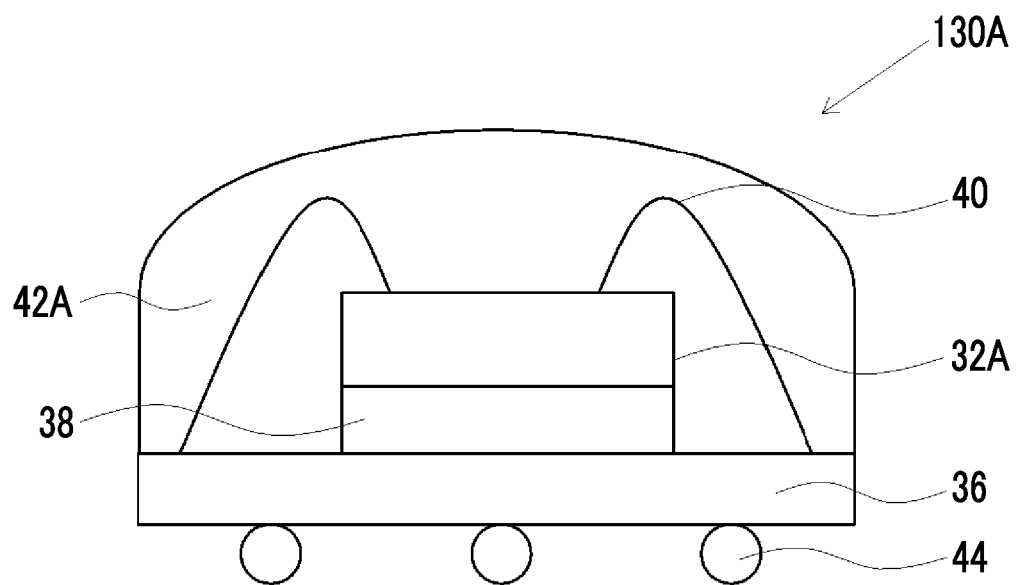
FIG. 5 is a cross-sectional view illustrating another embodiment of an electronic module which is a device of the present invention.

For example, as shown in FIG. 5, an electronic module 130A includes an electronic circuit 32A, a wiring board 36, an adhesive layer 38, a bonding wire 40, a mold 42A, and a solder ball 44. The difference between the electronic module 30A and the electronic module 130A is that, for example, the electronic module 130A does not include the organic layer 34A and the mold 42A includes the specific α-ray shielding agent.

In this aspect, the mold 42A including the specific α-ray shielding agent corresponds to the organic layer of the present invention.

FIG. 5 shows an aspect that the mold 42A includes the specific α-ray shielding agent, but the present invention is not limited to this aspect. For example, the adhesive layer 38 may include the specific α-ray shielding agent.

Embodiment B

Figure 6:
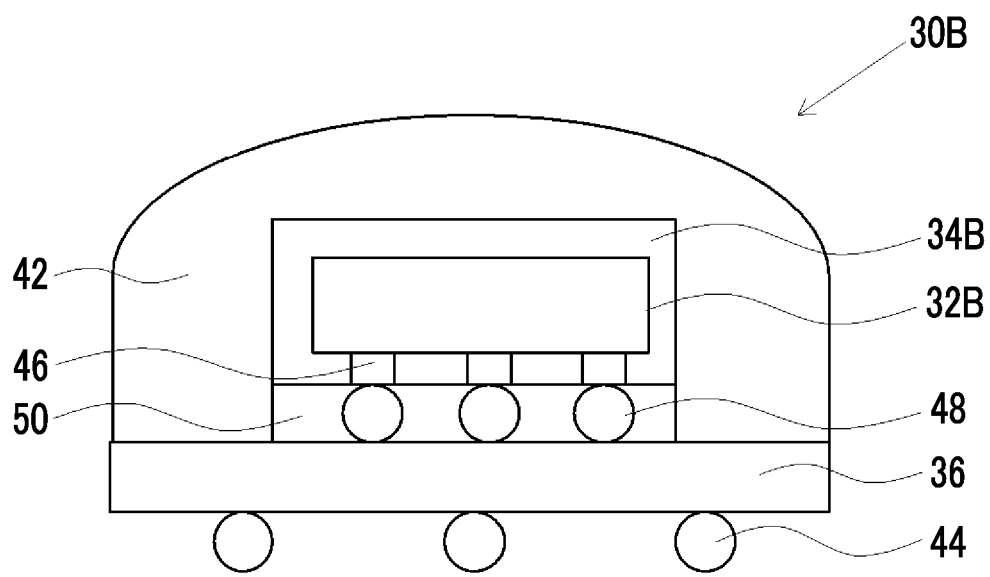
FIG. 6 is a cross-sectional view illustrating another embodiment of an electronic module which is a device of the present invention.

FIG. 6 shows another aspect of the second embodiment of the device according to the embodiment of the present invention.

The device shown in FIG. 6 is an electronic module 30B, and the electronic module 30B includes an electronic circuit 32B, an organic layer 34B including the specific α-ray shielding agent, a wiring board 36, a mold 42, a solder ball 44, a barrier metal portion 46, a bump 48, and an underfill 50.

The electronic module 30B has a so-called flip-chip structure.

In the electronic module 30B, a filler which may be included in the solder ball 44, bump 48, and mold 42 can be the α-ray source.

The electronic module 30B is mounted on a printed wiring board or the like through the solder ball 44.

Hereinafter, each member constituting the electronic module 30B will be described in detail. Regarding the members in the electronic module 30B, the same members as those in the electronic module 30A are denoted by the same reference mark, and the description thereof will be omitted.

The electronic circuit 32B has substantially the same configuration as the electronic circuit 32A of the electronic module 30A, but differs from the electronic circuit 32A in that the electronic circuit 32B has an electrode portion (not shown) on a surface of the wiring board 36 side. The electrode portion is in contact with the barrier metal portion 46 described later.

The organic layer 34B is a layer covering the electronic circuit 32B. In FIG. 6, the organic layer 34B differs from the organic layer 34A in a disposing position that the organic layer 34B is not disposed on the electrode portion (not shown) of the electronic circuit 32B, which is in contact with the barrier metal portion.

The organic layer 34B has the same configuration as the organic layer 34A except for the disposing position.

The barrier metal portion 46 is a member disposed between the electronic circuit 32B and the bump 48 described later.

The type of a metal atom constituting the barrier metal portion 46 is not particularly limited, and examples thereof include Ti, Ni, Au, Cu, and W.

The bump 48 is an electrode member disposed between the electronic circuit 32B and the wiring board 36 in order to electrically connect the both.

A method of forming the bump 48 is not particularly limited, and a method using a solder ball is preferable.

The type of a metal atom constituting the bump 48 is not particularly limited, and examples thereof include tin, silver, and copper.

A method of forming the bump 48 is not particularly limited, and examples thereof include a known method.

As described above, the bump 48 can be the α-ray source. In particular, in a case where the bump 48 is a solder bump formed using the solder ball, the bump 48 easily acts as the α-ray source.

The underfill 50 is a member disposed between the electronic circuit 32B and the wiring board 36 in order to improve adhesiveness therebetween.

The underfill 50 is usually composed of a resin. The type of the resin used for producing the underfill is not particularly limited, and examples thereof include an epoxy resin.

In FIG. 6, the organic layer 34B is disposed so as to cover the substantially entire surface (an area other than an area connected to the barrier metal portion 46) of the electronic circuit 32B, but the present invention is not limited to this aspect and it is sufficient that the organic layer 34B is disposed so as to cover at least a part of the electronic circuit 32B.

In addition, in the electronic module 30B of FIG. 6, at least one of the mold 42 or the underfill 50 may further include the specific α-ray shielding agent.

Furthermore, the electronic module 30B of FIG. 6 includes the organic layer 34B including the specific α-ray shielding agent, but the aspect is not limited as long as the organic layer including the specific α-ray shielding agent is included in the electronic module.

Figure 7:
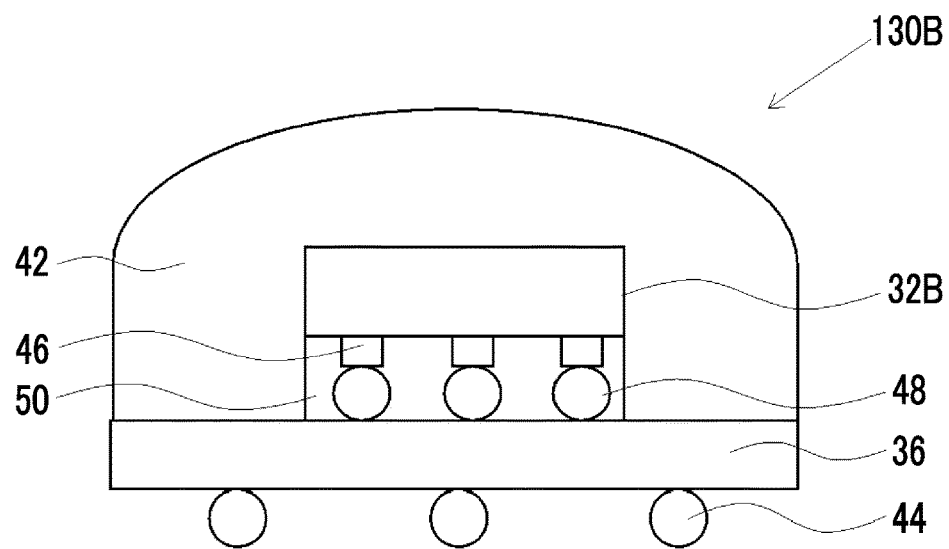
FIG. 7 is a cross-sectional view illustrating another embodiment of an electronic module which is a device of the present invention.

For example, as shown in FIG. 7, an electronic module 130B includes an electronic circuit 32B, a wiring board 36, a mold 42B, a solder ball 44, a barrier metal portion 46, a bump 48, and an underfill 50. The difference between the electronic module 30B and the electronic module 130B is that, for example, the electronic module 130B does not include the organic layer 34B and the mold 42B includes the specific α-ray shielding agent.

In this aspect, the mold 42B including the specific α-ray shielding agent corresponds to the organic layer of the present invention.

FIG. 7 shows an aspect that the mold 42B includes the specific α-ray shielding agent, but the present invention is not limited to this aspect. For example, the underfill may include the specific α-ray shielding agent.

Embodiment C

Figure 8:
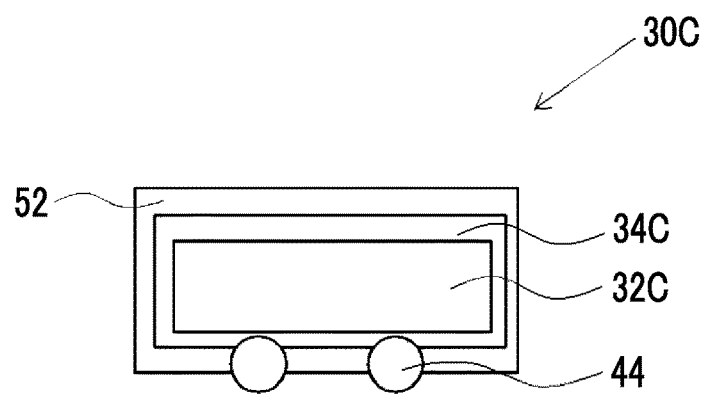
FIG. 8 is a cross-sectional view illustrating another embodiment of an electronic module which is a device of the present invention.

FIG. 8 shows another aspect of the second embodiment of the device according to the embodiment of the present invention.

The device shown in FIG. 8 is an electronic module 30C, and the electronic module 30C includes an electronic circuit 32C, an organic layer 34C including the specific α-ray shielding agent, a solder ball 44, and an electromagnetic wave shielding layer 52.

The electronic module 30C has a so-called fan-in wafer level package structure.

In the electronic module 30C, the solder ball 44 can be the α-ray source.

The electronic module 30C is mounted on a printed wiring board or the like through the solder ball 44.

Hereinafter, each member constituting the electronic module 30C will be described in detail. Regarding the members in the electronic module 30C, the same members as those in the electronic module 30A are denoted by the same reference mark, and the description thereof will be omitted.

The electronic circuit 32C has substantially the same configuration as the electronic circuit 32A of the electronic module 30A, but differs from the electronic circuit 32A in that the electronic circuit 32C has an electrode portion (not shown) on a surface of the solder ball 44 side. The electrode portion is in contact with the solder ball 44 described later.

In FIG. 8, the electrode portion (not shown) in the electronic circuit 32C is in contact with the solder ball 44, but the present invention is not limited to this aspect and may include other members as long as the both are electrically connected. For example, a so-called redistribution layer may be disposed therebetween. That is, the redistribution layer may be disposed on the surface of the electronic circuit 32C and the electronic circuit 32C and the solder ball 44 may be electrically connected to each other through the redistribution layer.

The redistribution layer serves as a layer rewiring the electrode portion of the electronic circuit. Examples of the material forming the redistribution layer include conductive substances such as copper, aluminum, silver, tin, and gold. The redistribution layer may be disposed so as to be embedded in an insulating layer disposed on the electronic circuit.

The organic layer 34C is a layer covering the electronic circuit 32C. In FIG. 8, the organic layer 34C differs from the organic layer 34A in a disposing position that the organic layer 34C is not disposed on the electrode portion (not shown) of the electronic circuit 32C, which is in contact with the solder ball 44.

The organic layer 34C has the same configuration as the organic layer 34A except for the disposing position.

The electromagnetic wave shielding layer 52 is a layer having a function of shielding electromagnetic waves, and is disposed so as to cover the electronic circuit 32C. The electromagnetic wave shielding layer 52 is not usually disposed on the solder ball 44 in order to secure contact property between the solder ball 44 and the printed wiring board.

The material constituting the electromagnetic wave shielding layer 52 is not particularly limited, and examples thereof include metals such as copper, aluminum, nickel, and stainless steel.

The electronic module 30C of FIG. 8 includes the electromagnetic wave shielding layer 52, but the present invention is not limited to this aspect and the electromagnetic wave shielding layer may not be disposed in the electronic module.

In addition, in FIG. 8, the order of laminate of the electromagnetic wave shielding layer 52 and the organic layer 34C may be reversed.

Furthermore, the electronic module 30C of FIG. 8 includes the organic layer 34C including the specific α-ray shielding agent, but the aspect is not limited as long as the organic layer including the specific α-ray shielding agent is included in the electronic module. For example, the electronic module may have an aspect that an organic layer including the specific α-ray shielding agent and an electromagnetic wave shielding agent covers the electronic circuit. In this case, the organic layer serves as the α-ray shielding layer and the electromagnetic wave shielding layer.

Embodiment D

FIG. 9 shows another aspect of the second embodiment of the device according to the embodiment of the present invention.

The device shown in FIG. 9 is an electronic module 30D, and the electronic module 30D includes an electronic circuit 32D, an organic layer 34D including the specific α-ray shielding agent, a mold 42, a solder ball 44, and a redistribution layer 54.

The electronic module 30D has a so-called fan-out wafer level package structure. In the fan-out wafer level package structure, by disposing the mold 42 and then disposing the redistribution layer 54 on the mold 42, it is possible to dispose the solder ball 44 at a position other than a surface of the electronic circuit 32D.

Hereinafter, each member constituting the electronic module 30D will be described in detail. Regarding the members in the electronic module 30D, the same members as those in the electronic module 30A are denoted by the same reference mark, and the description thereof will be omitted.

The electronic circuit 32D has substantially the same configuration as the electronic circuit 32A of the electronic module 30A, but differs from the electronic circuit 32A in that the electronic circuit 32D has an electrode portion (not shown) on a surface of the solder ball 44 side. The electrode portion is electrically connected to the solder ball 44 through the redistribution layer 54.

The organic layer 34D is a layer covering the electronic circuit 32D. The organic layer 34D differs from the organic layer 34A in a disposing position that the organic layer 34D is not disposed on the electrode portion (not shown) of the electronic circuit 32D, which is in contact with the redistribution layer 54.

The organic layer 34D has the same configuration as the organic layer 34A except for the disposing position.

The redistribution layer 54 serves as a layer rewiring the electrode portion (not shown) of the electronic circuit 32D. That is, the electrode portion (not shown) of the electronic circuit 32D is electrically connected to the solder ball 44 through the redistribution layer 54.

Examples of the material forming the redistribution layer 54 include conductive substances such as copper, aluminum, silver, tin, and gold.

The redistribution layer 54 may be disposed so as to be embedded in an insulating layer disposed on the electronic circuit.

Figure 10:
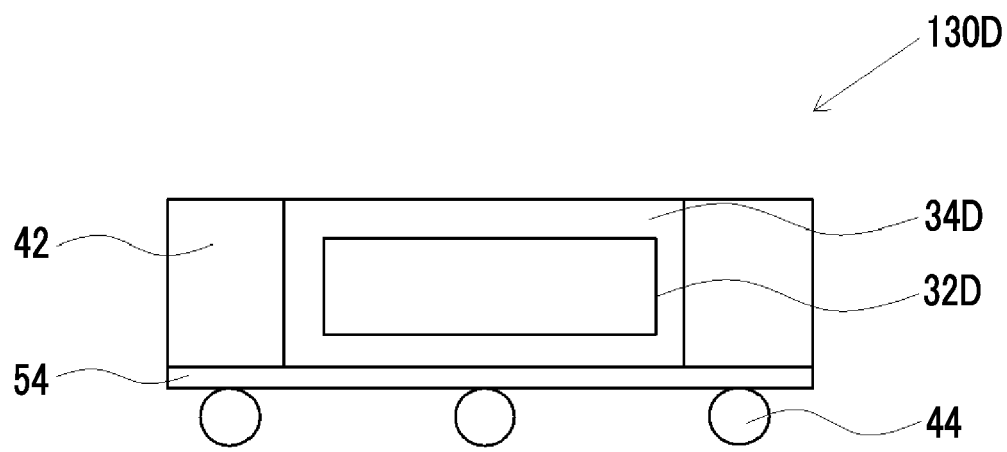
FIG. 10 is a cross-sectional view illustrating another embodiment of an electronic module which is a device of the present invention.

In FIG. 9, the mold 42 is disposed so as to cover the surface of the electronic circuit 32D other than a surface of the electronic circuit 32D on the side of the redistribution layer 54, but the present invention is not limited to this aspect and another aspect may be used as long as the redistribution layer can be formed in an area other than the surface of the electronic circuit. For example, as an electronic module 130D shown in FIG. 10, the mold 42 may be disposed so as to cover a surface other than the surface of the electronic circuit 32D on the side of the redistribution layer 54 and the surface of the electronic circuit 32D opposite to the redistribution layer 54.

In addition, in FIG. 9, the organic layer 34D is disposed so as to cover the substantially entire surface (an area other than the electrode portion for electrically connecting to the redistribution layer 54) of the electronic circuit 32D, but the present invention is not limited to this aspect and it is sufficient that the organic layer 34D is disposed so as to cover at least a part of the electronic circuit 32D. In addition, the organic layer may be further disposed at a position (for example, between the mold and the redistribution layer) other than the area covering the electronic circuit.

In addition, in the electronic module 30D of FIG. 9, the mold 42 may further include the specific α-ray shielding agent.

Furthermore, the electronic module 30D of FIG. 9 includes the organic layer 34D including the specific α-ray shielding agent, but the aspect is not limited as long as the organic layer including the specific α-ray shielding agent is included in the electronic module.

Figure 11:
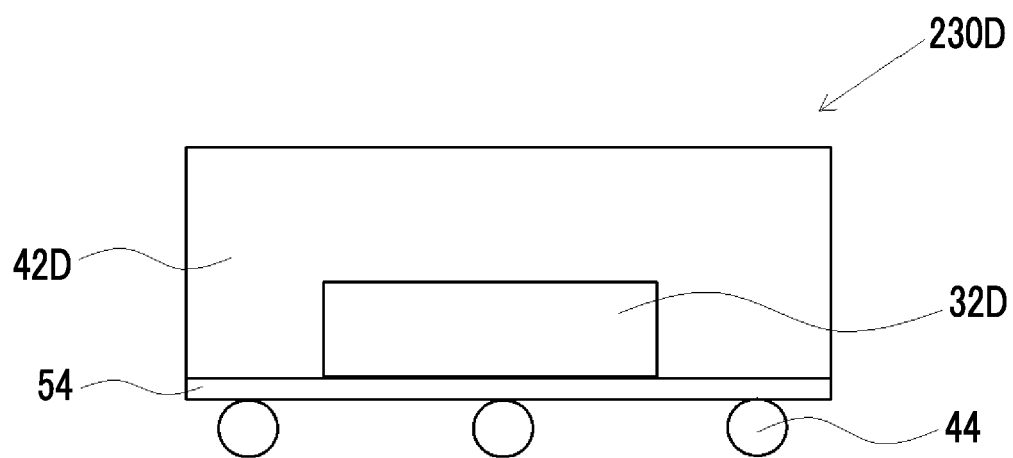
FIG. 11 is a cross-sectional view illustrating another embodiment of an electronic module which is a device of the present invention.

For example, as shown in FIG. 11, an electronic module 230D includes an electronic circuit 32D, a mold 42D, a solder ball 44, and a redistribution layer 54. The difference between the electronic module 230D and the electronic module 30D is that, for example, the electronic module 230D does not include the organic layer 34D and the mold 42D includes the specific α-ray shielding agent.

In this aspect, the mold 42D including the specific α-ray shielding agent corresponds to the organic layer of the present invention.

In addition, the electronic module 30D of FIG. 9 may further include the electromagnetic wave shielding layer. A disposing position of the electromagnetic wave shielding layer is not particularly limited, and an aspect that the electromagnetic wave shielding layer is disposed on the outermost side so as to cover the mold is preferable.

EXAMPLES

Hereinafter, the present invention will be described in more detail based on the examples. The materials, amounts used, proportions, treatment contents, and treatment procedures shown in the examples can be modified as appropriate in the range of not departing from the spirit of the present invention. Therefore, the scope of the present invention should not be construed as being limited to the examples.

<α-Ray Shielding Agent>

In the examples described later, the materials shown in Table 1 were used. Each polymer was synthesized by a known method.

In Table 1, the "type of atom" in the column of "first ionization potential" indicates an atom having the largest value of first ionization potential in the α-ray shielding agent.

In addition, in Table 1, the "type of atom" in the column of "electron numbers/covalent radius" indicates an atom having the largest value of electron numbers/covalent radius in the α-ray shielding agent.

TABLE 1

| No. | α-ray shielding agent Type | First ionization potential Type of atom | First ionization potential Value (kJ/mol) | Electron numbers/ covalent radius Type of atom | Electron numbers/ covalent radius Value (kJ/mol) | IPP (kJ/molÅ) | Refractive index | Density (g/cm³) | α-ray shielding ability | Visible light transmittance |
|---|---|---|---|---|---|---|---|---|---|---|
| 1 | BzMA / R∞TPFPB | F | 1681 | F | 12.7 | 9377 | 1.7 | 1.7 | 5 | 4 |
| 2 | (pentafluorobenzyl methacrylate) | F | 1681 | F | 12.7 | 10131 | 1.7 | 1.7 | 5 | 5 |
| 3 | BzMA / pentabromobenzyl methacrylate | O | 1314 | Br | 30.7 | 8151 | 1.8 | 2.5 | 4 | 5 |
| 4 | BzMA / triiodophenyl methacrylate | O | 1314 | I | 39.8 | 8510 | 1.8 | 2.5 | 4 | 5 |

TABLE 1-continued

| | | First ionization potential | | Electron numbers/ covalent radius | | | Re- frac- tive index | Den- sity (g/ cm³) | α-ray shield- ing ability | Visi- ble light trans- mit- tance |
|---|---|---|---|---|---|---|---|---|---|---|
| | α-ray shielding agent | Type of atom | Value (kJ/ mol) | Type of atom | Value (kJ/ mol) | IPP (kJ/ molÅ) | | | | |
| No. | Type | | | | | | | | | |
| 5 | TTO-51C (titanium oxide) (manufactured by ISHIHARA SANGYO KAISHA, LTD.) | O | 1314 | Ti | 16.2 | 13152 | 2.9 | 4.2 | 5 | 3 |
| 6 | [structures: BzMA (60), MAA (21), HEMA (19)] | O | 1314 | O | 11.0 | 6669 | 1.6 | 1.1 | 1 | 5 |
| 7 | [structures with subunits 10, 45, 10, 10, 25] | O | 1314 | O | 11.0 | 6845 | 1.5 | 1.1 | 1 | 5 |

In the α-ray shielding agents in Table 1, α-ray shielding ability X was calculated according to the following method and evaluated according to the following criteria.

First, a method of producing glass substrates with a film using the α-ray shielding agents 1 to 7 will be described below.

(α-Ray Shielding Agents 1 to 4, 6, and 7)

Each of the α-ray shielding agents was dissolved in propylene glycol monomethyl ether acetate (PGMEA) to prepare an α-ray shielding agent solution having a concentration of 40% by mass.

Next, a coating film was formed by applying the each α-ray shielding agent solution on a glass substrate (EAGLE XG 0.7 mm; manufactured by Corning Inc.) by a spin coating method such that a film thickness of the film after heating described later became 15.0 μm.

Next, the coating film was heated at 100° C. for 30 minutes using a hot plate, thereby obtaining a glass substrate with a film.

(α-Ray Shielding Agent 5)

An α-ray shielding agent solution was prepared by mixing α-ray shielding agent 5, Solsperse 36000 as a dispersing agent, and PGMEA at a mass ratio of 30:18:62, and being dispersed by a paint shaker.

A coating film was formed by applying the α-ray shielding agent dispersion solution on a glass substrate (EAGLE XG 0.7 mm; manufactured by Corning Inc.) by a spin coating method such that a film thickness of the film after heating described later became 15.0 μm.

Next, the coating film was heated at 350° C. for 30 minutes using a hot plate, thereby obtaining a glass substrate with a film.

Amounts of α-ray of the obtained glass substrates with a film and an uncoated glass substrate were measured using a low-level α-ray measuring device (LACS-4000M; manufactured by Sumitomo Chemical Co., Ltd.). In the substrate with a film, the amount of α-ray was measured by disposing a detector at a position facing the film. That is, an amount of α-ray in a case where α-ray emitted from the glass substrate transmitted the film was measured.

Using the amount A1 of α-ray of the substrate with a film and the amount A0 of α-ray of the uncoated glass substrate, the ratio (A1/A0) as α-ray shielding ability X was calculated and evaluated according to the following criteria.

5: A1/A0 was 0.01 or less
4: A1/A0 was more than 0.01 and 0.25 or less
3: A1/A0 was more than 0.25 and 0.50 or less
2: A1/A0 was more than 0.50 and 0.75 or less
1: A1/A0 was more than 0.75

Example A

Each component was mixed with the α-ray shielding agent shown in Table 1 according to the following composition, and the mixture was filtered using a nylon filter (manufactured by Nihon Pall Corporation) having a pore size of 0.45 μm, thereby preparing compositions 1 to 7 respectively. The number of the compositions is denoted according to the number of each α-ray shielding agent. For example, a composition formed using the α-ray shielding agent 1 is referred to as a composition 1.

| | |
|---|---|
| α-ray shielding agent shown in Table 1 | 32 parts by mass |
| Polymerizable compound: A-TMMT (manufactured by Shin-Nakamura Chemical Co., Ltd.) | 10 parts by mass |
| Photopolymerization initiator: IRGACURE-OXE01 | 3 parts by mass |
| Surfactant: Megafac F-781F | 0.03 parts by mass |
| Solvent: propylene glycol monomethyl ether acetate | 44.97 parts by mass |

A coating film was formed by applying the each composition prepared above on a glass substrate by a spin coating method such that a film thickness of the formed film became 15.0 μm.

Next, the coating film was heated at 100° C. for 2 minutes using a hot plate. Next, the entire surface of the coating film was exposed at an exposure amount of 20 J/cm$^2$ using an ultraviolet (UV) Cure device (manufactured by USHIO INC.) to obtain a glass substrate with an organic layer.

A known solid-state imaging element was combined with the obtained glass substrate with an organic layer, thereby producing the solid-state imaging device shown in FIG. 1.

The obtained solid-state imaging device was subjected to an image capturing test to evaluate the influence of noise due to α-ray.

In comparison with a case of using the compositions 1 to 5, each of which includes α-ray shielding agents 1 to 5 exhibiting a predetermined α-ray shielding ability X, and a case of using the compositions 6 and 7, each of which includes α-ray shielding agents 6 and 7 not exhibiting a predetermined α-ray shielding ability X, the noise due to α-ray was reduced in the case of using the compositions 1 to 5.

(Visible Light Transmittance)

The minimum transmittance of the obtained substrate with a film at 400 to 700 nm was measured using a spectrophotometer (MCPD 3700; manufactured by OTSUKA ELECTRONICS Co., LTD.) and using the uncoated glass substrate as a reference, and the minimum transmittance of the film in the substrate with a film was obtained and evaluated according to the following criteria.

5: minimum transmittance at 400 to 700 nm was more than 95%
  4: minimum transmittance at 400 to 700 nm was 95% or less and more than 90%
  3: minimum transmittance at 400 to 700 nm was 90% or less and more than 70%
  2: minimum transmittance at 400 to 700 nm was 70% or less and more than 50%
  1: minimum transmittance at 400 to 700 nm was 50% or less Example B Using the above-described compositions 1 to 7, the organic layer 34A shown in FIG. 4 was formed to produce an electronic module.

An evaluation of soft error was performed using the obtained electronic module. In comparison with a case of using the compositions 1 to 5 and a case of using the compositions 6 and 7, the soft error was clearly reduced in the case of using the comparisons 1 to 5.

EXPLANATION OF REFERENCES

10A, 10B, 10C: solid-state imaging device
12: solid-state imaging element
14: color filter
14R: red color filter
14G: green color filter
14B: blue color filter
16: microlens
18, 18A: transparent resin layer
20: α-ray shielding layer
22: glass substrate
24: infrared cut filter
26: infrared transmission filter
30A, 30B, 30C, 30D, 130A, 130B, 130D, 230D: electronic module
32A, 32B, 32C, 32D: electronic circuit
34A, 34B, 34C, 34D: organic layer
36: wiring board
40: bonding wire
42, 42A, 42B, 42D: mold
44: solder ball
46: barrier metal portion
48: bump
50: underfill
52: electromagnetic wave shielding layer
54: redistribution layer

What is claimed is:

1. A device comprising:
    an α-ray source;
    an electronic circuit influenced by α-ray; and
    an organic layer including an α-ray shielding agent,
    wherein an α-ray shielding ability X of the α-ray shielding agent, which is calculated by the following method, is 0.50 or less,
    the method of calculating the α-ray shielding ability X: a laminate having a glass substrate and a layer which is composed of the α-ray shielding agent and is disposed on a surface of the glass substrate, and a glass substrate on which no layer being composed of the α-ray shielding agent is disposed are prepared, an amount A1 of α-ray in the laminate on the side of the layer being composed of the α-ray shielding agent and an amount A0 of α-ray in the glass substrate on which no layer being composed of the α-ray shielding agent is disposed are calculated using an α-ray measuring device, and the α-ray shielding ability X which is a ratio of the amount A1 of α-ray to the amount A0 of α-ray is calculated, and
    wherein the electronic circuit is one selected from the group consisting of a logic circuit, a storage circuit, and a communication circuit, and
    the device functions as an electronic module.

2. The device according to claim 1,
    wherein the α-ray source is a glass substrate,
    the electronic circuit is a solid-state imaging element including a photoelectric conversion portion,
    the organic layer is disposed between the α-ray source and the electronic circuit, and
    the device functions as a solid-state imaging device.

3. The device according to claim 2,
    wherein a film thickness of the organic layer is 20 μm or less.

4. The device according to claim 3,
    wherein a minimum transmittance of the organic layer in a visible light region is 70% or more.

5. The device according to claim 3,
    wherein the α-ray shielding agent is a polymer.

6. The device according to claim 2,
    wherein a minimum transmittance of the organic layer in a visible light region is 70% or more.

7. The device according to claim 6,
wherein the α-ray shielding agent is a polymer.
8. The device according to claim 2,
wherein the α-ray shielding agent is a polymer.
9. The device according to claim 2,
wherein a density of the α-ray shielding agent is 1.4 g/cm$^3$ or more and 6.0 g/cm$^3$ or less.
10. The device according to claim 1, further comprising:
at least one selected from the group consisting of a solder ball electrically connected to the electronic circuit, a solder bump electrically connected to the electronic circuit, and a mold including a filler, which covers at least a part of the electronic circuit,
wherein the α-ray source is at least one of the solder ball, the solder bump, or the filler.
11. The device according to claim 10,
wherein the α-ray shielding agent is a polymer.
12. The device according to claim 1,
wherein the α-ray shielding agent is a polymer.
13. The device according to claim 1,
wherein a density of the α-ray shielding agent is 1.4 g/cm$^3$ or more and 6.0 g/cm$^3$ or less.
14. The device according to claim 1,
wherein an ionization potential parameter of the α-ray shielding agent is 7000 KJ/mol Å or more and 25000 KJ/mol Å or less.
15. The device according to claim 1,
wherein a refractive index of the α-ray shielding agent at a wavelength of 589.3 nm is 1.7 or more and 3.0 or less.
16. The device according to claim 1,
wherein the α-ray shielding agent includes a halogen atom.
17. The device according to claim 1,
wherein the α-ray shielding agent is metal particles or metal oxide particles having a density of 4.0 to 6.0 g/cm$^3$.

* * * * *